United States Patent
Wu

(10) Patent No.: US 7,579,672 B2
(45) Date of Patent: Aug. 25, 2009

(54) SEMICONDUCTOR PACKAGE WITH ELECTROMAGNETIC SHIELDING CAPABILITIES

(75) Inventor: Chia-fu Wu, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 12/019,892

(22) Filed: Jan. 25, 2008

(65) Prior Publication Data
US 2008/0179718 A1    Jul. 31, 2008

(30) Foreign Application Priority Data
Jan. 26, 2007    (TW) ............................... 96103076 A

(51) Int. Cl.
*H01L 23/552*    (2006.01)

(52) U.S. Cl. .................. 257/659; 257/422; 257/706; 257/E23.114; 257/E23.116

(58) Field of Classification Search ................ 257/422, 257/659, 662, 706, 730, 508, 663, E23.114, 257/E23.116
See application file for complete search history.

(56) References Cited

U.S. PATENT DOCUMENTS

| 7,109,410 B2 * | 9/2006 | Arnold et al. | ............... 174/390 |
| 7,477,197 B2 * | 1/2009 | Zheng et al. | .......... 343/700 MS |

\* cited by examiner

*Primary Examiner*—Quoc D Hoang
(74) *Attorney, Agent, or Firm*—Raymond J. Ho; Morris Manning & Martin

(57) ABSTRACT

A semiconductor package with electromagnetic shielding capabilities is disclosed. The semiconductor package includes a substrate (101), a plurality of semiconductor dies (102), a plurality of shielding metal elements (103), a plurality of grounding metal elements (104) and a plurality of conductive metal elements (110). The semiconductor dies are disposed on an upper surface (105) of the substrate along a horizontal direction. The shielding metal elements are provided on the upper surface of the substrate, and are arranged between and around the semiconductor dies so that each semiconductor die is surrounded by the shielding metal elements and thus electromagnetic interference in the horizontal direction can be effectively shielded from each semiconductor die.

13 Claims, 3 Drawing Sheets

SEMICONDUCTOR PACKAGE WITH ELECTROMAGNETIC SHIELDING CAPABILITIES

BACKGROUND OF THE INVENTION

1. Field of the Invention

The present invention relates to a semiconductor package, and particularly to a semiconductor package with electromagnetic shielding capabilities.

2. Description of Prior Art

Electromagnetic interference (EMI) is a naturally occurring electromagnetic phenomenon. The electromagnetic waves generated by electrical or electronic devices in operation may interfere with other surrounding electrical or electronic devices, which has adverse influences on the normal operation and the stable signal transmission of these devices. Further, excessive electromagnetic interference causes electromagnetic contamination, which adversely affects the human health and destructs the zoological balance. Electromagnetic compatibility between component devices of an electrical or electronic system is thus required to avoid function degradation or damage of the component devices caused by the electromagnetic interference therebetween, thereby ensuring the normal operation of the entire system. However, with the rapid development of the electrical and electronic industry, it has become more and more difficult to obtain such an electromagnetic compatibility status. To achieve the electromagnetic compatibility of the entire system, the amount of electromagnetic radiation emitted by each power consumption component of the system is required to be limited to a predetermined amount, and each power consumption component is also required to have a certain anti-interference capability. Only when both the amount of electromagnetic radiation emitted by each system component is limited and the anti-interference capability of each system component is improved, can the electromagnetic compatibility of the entire system be obtained.

Typically, in high-density semiconductor packaging, multiple dies can be arranged side-by-side or can be stacked vertically within the package to form a system-in-package (SiP). However, mutual electromagnetic interference occurs between the dies in the package, and external electromagnetic signals also interfere with the operation of these dies, which may result in damage of the dies and malfunction of the package incorporating these dies.

Hence, an improved semiconductor package having a shielding structure is desired to provide a more effective electromagnetic shielding capability. It is further desired that this shielding structure should not raise the overall height of the semiconductor package while effectively shielding electromagnetic interference between adjacent dies of the semiconductor package.

SUMMARY OF THE INVENTION

An object of the present invention is to provide a semiconductor package having shielding metal balls disposed between and around adjacent dies thereof to effectively shield electromagnetic interference.

To achieve the above object, the present invention provides a semiconductor package with electromagnetic shielding capabilities. The semiconductor package includes a substrate, a plurality of semiconductor dies, a plurality of shielding metal elements, a plurality of grounding metal elements and a plurality of conductive metal elements. The semiconductor dies are disposed on an upper surface of the substrate along a horizontal direction in a spaced relationship with respect to one another. Each semiconductor die has a lower surface with a plurality of bumps formed thereon to electrically connect the semiconductor die with the substrate, whereby a connection area is defined between the lower surface of the semiconductor die and the upper surface of the substrate. The shielding metal elements, preferably in the form of metal balls, are provided on the upper surface of the substrate, and are arranged between and around the semiconductor dies so that each semiconductor die is surrounded by the shielding metal elements and thus electromagnetic interference in the horizontal direction can be effectively shielded from each semiconductor die. That is, a portion of the shielding metal elements is arranged between adjacent semiconductor dies so that the electromagnetic interference between the adjacent semiconductor dies can be shielded, and the remaining portion of the shielding metal elements is arranged around the outer peripheries of the semiconductor dies so that the external electromagnetic interference can also be shielded. Each shielding metal element has a height substantially equal to or smaller than a sum of height of the connection area and height of the semiconductor die.

Preferably, the present semiconductor package further includes a heat spreader that is disposed on the semiconductor dies to enhance the heat dissipation efficiency.

Further, a molding compound is preferably applied between the heat spreader and the upper surface of the substrate to increase the engagement strength between the heat spreader and the substrate.

Accordingly, the present semiconductor package provides a more effective EMI shielding capability by the employment of a plurality of shielding metal elements disposed between and around the semiconductor dies. Further, the overall vertical height of the present semiconductor package employing these shielding metal elements is not increased while providing such an effective EMI shielding effect. In addition, a heat spreader and a molding compound can be further incorporated into the present semiconductor package to respectively enhance the heat dissipation efficiency and the structural strength of the present semiconductor package.

BRIEF DESCRIPTION OF THE DRAWINGS

The present invention may be best understood through the following description with reference to the accompanying drawings, in which.

DETAILED DESCRIPTION OF THE PREFERRED EMBODIMENTS

Figure 1:
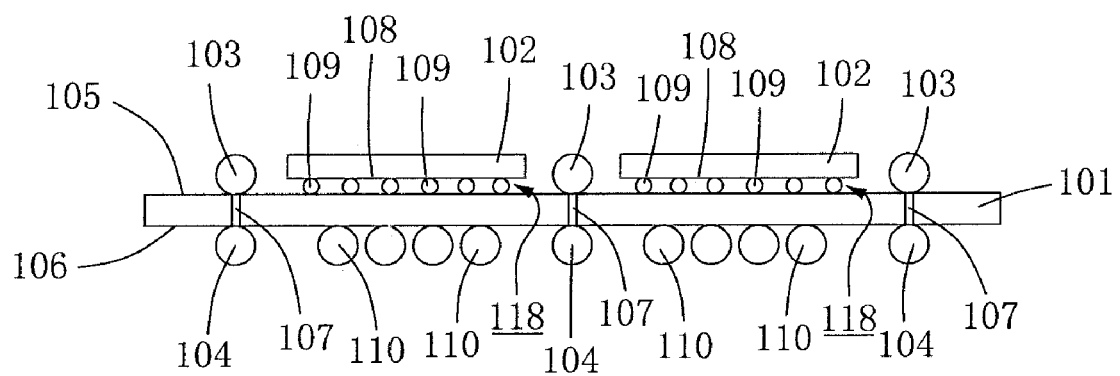
FIG. 1 is a schematic view of a semiconductor package with electromagnetic shielding capabilities in accordance with a first embodiment of the present invention.

Referring to FIG. 1, a semiconductor package with electromagnetic shielding capabilities in accordance with a first embodiment of the present invention includes a substrate 101, a plurality of semiconductor dies 102 (two shown for simplicity), a plurality of shielding metal elements 103, a plurality of grounding metal elements 104 and a plurality of conductive metal elements 110. The shielding metal elements 103, the grounding metal elements 104 and the conductive metal elements 110 are all preferably in the form of metal balls as shown.

The substrate 101 has an upper surface 105 and a lower surface 106 opposite to the upper surface 105. A plurality of vias 107 is defined through the substrate 101. The semiconductor dies 102 are disposed on an upper surface 105 of the substrate 101 along a horizontal direction, and are arranged substantially in a side-by-side relationship with respect to one another. Each semiconductor die 102 has a lower surface 108 with a plurality of bumps 109 formed thereon to electrically connect the semiconductor die 102 with corresponding circuits (not shown) on the substrate 101. A connection area 118 is thus defined between the lower surface 108 of the semiconductor die 102 and the upper surface 105 of the substrate 101. The plurality of bumps 109 is located within the connection area 118 to electrically connect each semiconductor die 102 with the substrate 101. An underfill material may be injected into the connection area 118 as desired to bond the semiconductor die 102 and the substrate 101 together. The shielding metal elements 103 are provided on the upper surface 105 of the substrate 101, and are arranged between and around the semiconductor dies 102 so that each semiconductor die 102 is surrounded by the shielding metal elements 103 and thus electromagnetic interference in the horizontal direction can be effectively shielded from each semiconductor die 102. In detail, a portion of the shielding metal elements 103 is arranged between adjacent semiconductor dies 102 so that the electromagnetic interference between the adjacent semiconductor dies 102 can be shielded, and the remaining portion of the shielding metal elements 103 is arranged around the outer peripheries of the semiconductor dies 102 so that the external electromagnetic interference can also be shielded. Each shielding metal element 103 is electrically connected with an upper portion of a corresponding via 107 of the substrate 101, and has a height substantially equal to or smaller than a sum of height of the connection area 118 and height of the semiconductor die 102.

The grounding metal elements 104 are provided on the lower surface 106 of the substrate 101 and are each electrically connected with a lower portion of a corresponding via 107 of the substrate 101. The grounding metal elements 104 are adapted to electrically connect with other grounding circuits (not shown), so that the shielding metal elements 103 can be grounded through the vias 107. The conductive metal elements 110, also provided on the lower surface 106 of the substrate 101, are electrically connected with corresponding circuits (not shown) of the substrate 101 and serve as an input/output interface of the substrate 101 to input/output electrical signals from/to an external device, such as a motherboard. It should be noted that the shielding metal elements 103 and the grounding metal elements 104 of the present invention are respectively adopted for EMI shielding and grounding (or heat conducting) purposes, not for input/output of electrical signals. Therefore, the functions of the shielding metal elements 103 and the grounding metal elements 104 are completely different from that of the conductive metal elements 110.

Figure 2:
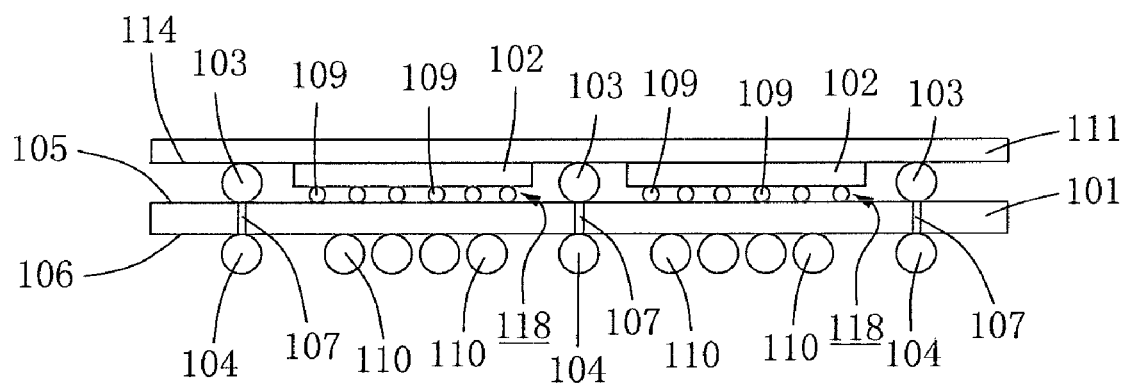
FIG. 2 is a schematic view of a semiconductor package with electromagnetic shielding capabilities in accordance with a second embodiment of the present invention.

Reference is now directed to FIG. 2, which is a schematic view of a semiconductor package with electromagnetic shielding capabilities in accordance with a second embodiment of the present invention. This embodiment is different from the first embodiment in that a heat spreader 111 is further provided on the semiconductor dies 102. The heat spreader 111 has a lower surface 114 in contact with the tops of the shielding metal elements 103, so that the heat spreader 111 is grounded through the shielding metal elements 103, the vias 107 and the grounding metal elements 104. The adoption of the heat spreader 111 enhances the heat dissipation efficiency of the semiconductor package of the second embodiment. To achieve the heat dissipation purpose, the heat spreader 111 is preferably made of high thermal conductive metal materials such as copper, aluminum, silver and gold. A heat dissipation layer may be further selectively provided between the heat spreader 111 and each semiconductor die 102 for enhancing heat dissipation efficiency. The heat dissipation layer 117 is preferably in the form of thermal paste, for example, thermally conductive silver-filled paste.

Figure 3:
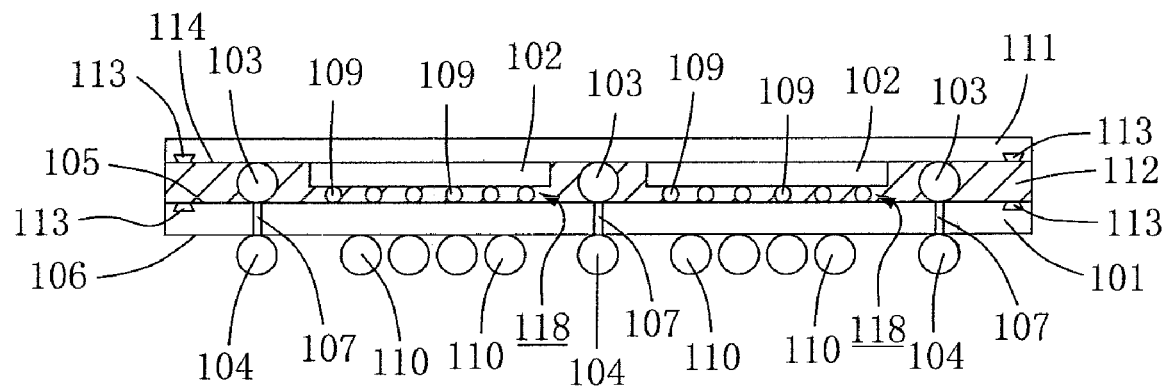
FIG. 3 is a schematic view of a semiconductor package with electromagnetic shielding capabilities in accordance with a third embodiment of the present invention.

FIG. 3 is a schematic view of a semiconductor package with electromagnetic shielding capabilities in accordance with a third embodiment of the present invention. This embodiment is different from the second embodiment in that a molding compound 112 is further applied between the heat spreader 111 and the substrate 101 to reliably retain the heat spreader 111 on the substrate 101. In addition, at least one engagement hole 113 is defined in each of the lower surface 114 of the heat spreader 111 and the upper surface 105 of the substrate 101. The engagement holes 113 are filled with the molding compound 112 during injection molding of the molding compound 112, whereby the bonding strength between the substrate 101, the heat spreader 111 and the molding compound 112 is further increased. The engagement hole 113 may be in the form of a chamfered blind hole or a chamfered through hole.

In comparison with the conventional design, the present semiconductor package provides a more effective EMI shielding capability by the employment of a plurality of shielding metal elements 103 disposed between and around the semiconductor dies 102. Further, the overall vertical height of the present semiconductor package employing these shielding metal elements 103 is not increased while providing such an effective EMI shielding effect. In addition, a heat spreader 111 and a molding compound 112 can be further incorporated into the present semiconductor package to respectively enhance the heat dissipation efficiency and the structural strength of the present semiconductor package.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A semiconductor package, comprising:
    a substrate having an upper surface, a lower surface opposite to the upper surface and a plurality of vias defined therethrough;
    a plurality of semiconductor dies disposed on the upper surface of the substrate along a horizontal direction;
    a plurality of shielding metal elements disposed on the upper surface of the substrate and electrically connected with upper portions of corresponding vias, the shielding metal elements shielding the semiconductor dies from electromagnetic interference in the horizontal direction, wherein a portion of the shielding metal elements is arranged between adjacent semiconductor dies to shield the electromagnetic interference between the adjacent semiconductor dies; and
    a plurality of grounding metal elements disposed on the lower surface of the substrate and electrically connected with lower portions of corresponding vias.

2. The semiconductor package as claimed in claim 1, wherein each semiconductor die has a lower surface defining a connection area together with the upper surface of the substrate, and the semiconductor package further comprising a plurality of bumps located within the connection area to electrically connect each semiconductor die with the substrate.

3. The semiconductor package as claimed in claim 2, wherein each shielding metal element has a height substantially equal to a sum of height of the connection area and height of the semiconductor die.

4. The semiconductor package as claimed in claim 2, wherein each shielding metal element has a height smaller than a sum of height of the connection area and height of the semiconductor die.

5. The semiconductor package as claimed in claim 1, wherein a portion of the shielding metal elements is arranged around outer peripheries of the semiconductor dies to shield the semiconductor dies from external electromagnetic interference.

6. The semiconductor package as claimed in claim 1, further comprising a plurality of conductive metal elements provided on the lower surface of the substrate to serve as an input/output interface of the substrate.

7. A semiconductor package, comprising:
- a substrate having an upper surface, a lower surface opposite to the upper surface and a plurality of vias defined therethrough;
- a plurality of semiconductor dies disposed on the upper surface of the substrate along a horizontal direction;
- a plurality of shielding metal elements disposed on the upper surface of the substrate and electrically connected with upper portions of corresponding vias, the shielding metal elements shielding the semiconductor dies from electromagnetic interference in the horizontal direction;
- a plurality of grounding metal elements disposed on the lower surface of the substrate and electrically connected with lower portions of corresponding vias; and
- a heat spreader disposed on the semiconductor dies, wherein the heat spreader is in contact with tops of the shielding metal elements.

8. The semiconductor package as claimed in claim 7, further comprising a heat dissipation layer provided between the heat spreader and each semiconductor die.

9. The semiconductor package as claimed in claim 7, further comprising a molding compound provided between the heat spreader and the substrate.

10. The semiconductor package as claimed in claim 9, wherein the heat spreader has a lower surface defining at least one engagement hole, the at least one engagement hole being filled with the molding compound.

11. The semiconductor package as claimed in claim 10, wherein the at least one engagement hole of the heat spreader is in the form of a chamfered hole.

12. The semiconductor package as claimed in claim 9, wherein the upper surface of the substrate defines at least one engagement hole, the at least one engagement hole being filled with the molding compound.

13. The semiconductor package as claimed in claim 12, wherein the at least one engagement hole of the substrate is in the form of a chamfered hole.

* * * * *